US012765067B2

(12) United States Patent
Villaret et al.

(10) Patent No.: US 12,765,067 B2
(45) Date of Patent: Oct. 13, 2026

(54) METHOD FOR MANUFACTURING HIGH-VOLTAGE TRANSISTORS ON A SILICON-ON-INSULATOR TYPE BULK

(71) Applicant: STMicroelectronics (Crolles 2) SAS, Crolles (FR)

(72) Inventors: Alexandre Villaret, Eybens (FR); Olivier Weber, Grenoble (FR); Franck Arnaud, St Nazaire les Eymes (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 474 days.

(21) Appl. No.: 18/343,298

(22) Filed: Jun. 28, 2023

(65) Prior Publication Data

US 2024/0014215 A1 Jan. 11, 2024

(30) Foreign Application Priority Data

Jul. 6, 2022 (FR) ...................................... 2206882

(51) Int. Cl.

| | |
|---|---|
| ***H10D 87/00*** | (2026.01) |
| ***H10D 30/63*** | (2025.01) |
| ***H10D 86/01*** | (2026.01) |

(52) U.S. Cl.

CPC ........... *H10D 87/00* (2025.01); *H10D 30/637* (2025.01); *H10D 86/01* (2025.01)

(58) Field of Classification Search

CPC ....... H10D 87/00; H10D 86/01; H10D 30/637

See application file for complete search history.

(56) References Cited

U.S. PATENT DOCUMENTS

| | | | | |
|---|---|---|---|---|
| 2006/0216898 | A1* | 9/2006 | Tigelaar ............... | H10D 86/201 438/295 |
| 2009/0096026 | A1* | 4/2009 | Bryant ............... | H10D 30/6717 438/151 |
| 2015/0155300 | A1 | 6/2015 | Hoshino | |
| 2016/0284807 | A1 | 9/2016 | Petit et al. | |
| 2018/0090386 | A1 | 3/2018 | Faul et al. | |
| 2019/0057981 | A1 | 2/2019 | Fagot et al. | |

* cited by examiner

*Primary Examiner* — Richard A Booth

(74) *Attorney, Agent, or Firm* — Slater Matsil, LLP

(57) ABSTRACT

A method can be used for manufacturing a high-voltage transistor in and on a high-voltage region of a silicon-on-insulator type bulk that includes a semiconductor film having a first thickness, electrically insulated from a carrier bulk by a buried dielectric layer. The semiconductor film in the high-voltage region is selectively epitaxially grown to a second thickness that is greater than the first thickness while the semiconductor film remains at the first thickness in a region outside the high-voltage region.

20 Claims, 5 Drawing Sheets

METHOD FOR MANUFACTURING HIGH-VOLTAGE TRANSISTORS ON A SILICON-ON-INSULATOR TYPE BULK

CROSS-REFERENCE TO RELATED APPLICATIONS

This application claims priority to French Patent Application No. 2206882, filed on Jul. 6, 2022, which application is hereby incorporated herein by reference.

TECHNICAL FIELD

Embodiments and implementations relate to microelectronics, in particular to the manufacture of semiconductor devices comprising high-voltage transistors in and on an SOI (Silicon-on-insulator) type bulk.

BACKGROUND

Semiconductor devices on an SOI or FDSOI (Fully Depleted Silicon-on-insulator) type bulk typically have semiconductor components such as MOS (metal oxide semiconductor) transistors.

MOS transistors operating at different voltage ranges can be manufactured from a single SOI bulk capable of providing better performance than a monolithic silicon bulk or substrate. For example, high-voltage MOS transistors can be co-integrated with other semiconductor devices on an SOI bulk.

However, high-voltage transistors manufactured from an SOI bulk are subject to the phenomenon of hot carrier injection (HCI). Hot carrier injection results in long-term drift of the threshold voltage and linear and saturated currents of the transistors, leading to degradation of the performance of high-voltage transistors.

Consequently, additional steps to provide a monolithic bulk region located in the SOI bulk are conventionally provided for the manufacture of high-voltage transistors, so as to limit the phenomenon of hot carrier injection. In particular, the electronic components, such as the high-voltage transistors, made in the localized monolithic region are formed in the carrier bulk while the components of other regions are formed on a thin film insulated from the carrier bulk by a buried silicon oxide layer.

Moreover, the localized monolithic bulk region does not allow in particular the "fully depleted" effect, nor an advantageous "partially depleted" effect of SOI techniques. This limits the performance of high-voltage transistors formed on the carrier bulk, in particular in terms of short channel control, density, and disparities of characteristics between transistors.

There is a need to design high-voltage transistors from a silicon-on-insulator type bulk that do not suffer from the above-mentioned drawbacks and to increase their reliability.

SUMMARY

A solution is therefore provided which makes it possible to form, in a region of the SOI bulk, a thin film with a thickness sufficiently high to make it possible to manufacture high-voltage transistors in this region of the bulk without causing a loss of performance during the operation of these transistors, in particular without suffering from the phenomena of hot carrier injection.

According to an embodiment, a method is provided for manufacturing at least one high-voltage transistor in and on a high-voltage region of a silicon-on-insulator type bulk including a semiconductor film having a first thickness, electrically insulated from a carrier bulk by a buried dielectric layer.

A method embodiment may include epitaxially growing the semiconductor film to a second thickness greater than the first thickness, selectively in the high-voltage region.

It is thus suggested to increase the thickness of the semiconductor film selectively, i.e. only in the high-voltage region of the silicon-on-insulator type bulk, and not in any other "first" region of the bulk, for example. The first region, distinct from the high-voltage region, may be, for example, a low-voltage region in and on which transistors operating at lower voltage ranges than the high-voltage transistors, for example voltages below 2 volts, may be formed, whereas the high-voltage transistors may be intended to operate at voltages above 2 volts, for example.

Consequently, a method embodiment may allow to form, in the high-voltage region where the high-voltage transistors are manufactured, a semiconductor film that may be sufficiently thick to avoid the hot carrier injection phenomenon, but also may be sufficiently thin to benefit from the performance advantages of silicon-on-insulator devices, and thus improve the performance of the high-voltage transistors.

According to an embodiment, the method may include epitaxially growing the carrier bulk in a localized monolithic region of the silicon-on-insulator type bulk, wherein the growth of the semiconductor film in the high-voltage region is performed simultaneously with the growth of the carrier bulk in the localized monolithic region.

Thus, a "free of charge" growth of the semiconductor film may be achieved since it is performed in the same step as the growth of the carrier bulk provided in the localized monolithic region.

According to an embodiment, the growth of the carrier bulk in the localized monolithic region may include a formation of a hard mask covering the semiconductor film in the high-voltage region and uncovering the semiconductor film in the localized monolithic region, oxidizing the semiconductor film in the localized monolithic region, and etching selectively removing the oxidized semiconductor film and the buried dielectric layer in the localized monolithic region. The growth of the semiconductor film in the high-voltage region may include etching adapted to remove the hard mask in the high-voltage region prior to the epitaxial growth of the semiconductor film in the high-voltage region.

In an embodiment, it may be possible to limit the number of additional masks required to perform growth of the semiconductor film in the high-voltage region and may make it possible to benefit from the mutualization of the growth step of the carrier bulk in the monolithic region.

According to an embodiment, the growth of the semiconductor film may include a formation of a dedicated hard mask uncovering the semiconductor film in the high-voltage region, prior to the epitaxial growth of the semiconductor film in the high-voltage region. This may allow to control the thickness of the semiconductor film in the high-voltage region independently of the restrictions of another epitaxy step.

The thickness of the semiconductor film in the high-voltage region may thus be set to a size specifically dimensioned for high-voltage transistors.

According to an embodiment, the method may include forming a gate region of the at least one high-voltage transistor on the semiconductor film having the second thickness of the high-voltage region, and forming conduction regions of the at least one high-voltage transistor in the semiconductor film having the second thickness of the high-voltage region.

The semiconductor film in the high-voltage region may be used for forming conduction regions of MOS-type transistors intended to operate at relatively high voltages, in the order of 3.3 volts, for example.

According to an embodiment, the second thickness of the semiconductor film in the high-voltage region may be sufficiently small to generate a fully depleted state throughout the thickness of the semiconductor film in the presence of a channel region of the at least one high-voltage transistor.

Indeed, a semiconductor film in a fully depleted state may allow for ensuring a better electrostatic control of the channel of the high-voltage transistors and to reduce short channel effects.

According to an embodiment, the first thickness may be less than or equal to 7 nm and the second thickness may be between 20 nm and 25 nm.

A second thickness of the semiconductor film less than or equal to 25 nm may result in a fully depleted semiconductor film, and a second thickness of the film greater than or equal to 20 nm may result in limited "impact ionization." Impact ionization may generate hot carriers, which may be likely to be stored in the gate dielectric regions of high-voltage transistors, thus degrading performance of the transistors.

According to an embodiment, a semiconductor device may be provided including at least one high-voltage transistor formed in and on a high-voltage region of a silicon-on-insulator type bulk including a semiconductor film, electrically insulated from a carrier bulk by a buried dielectric layer. The semiconductor film may have a first thickness in a first region different from the high-voltage region and may have a second thickness greater than the first thickness in the high-voltage region.

According to an embodiment, the at least one high-voltage transistor may include a gate region located at the semiconductor film having the second thickness in the high-voltage region, and conduction regions formed in the semiconductor film having the second thickness in the high-voltage region.

According to an embodiment, the second thickness of the semiconductor film in the high-voltage region may be sufficiently small to generate a fully depleted state throughout the thickness of the semiconductor film in the presence of a channel region of the at least one high-voltage transistor.

According to an embodiment, the first thickness may be less than or equal to 7 nm and the second thickness may be between 20 nm and 25 nm.

According to an embodiment, a method of manufacturing a semiconductor device may include forming a hard mask on a silicon-on-insulator type bulk, wherein the silicon-on-insulator type bulk comprises a semiconductor film having a first thickness, electrically insulated from a carrier bulk by a buried dielectric layer. The hard mask may include a high-voltage mask portion covering the semiconductor film in a high-voltage region, wherein the hard mask includes a first opening uncovering the semiconductor film in a localized monolithic region. Then, the method may include oxidizing the semiconductor film in the localized monolithic region; etching selectively to remove the oxidized semiconductor film and the buried dielectric layer at the first opening in the localized monolithic region; etching selectively the hard mask to remove the high-voltage mask portion, such that the hard mask comprises a second opening uncovering the semiconductor film in the high-voltage region; epitaxially growing the semiconductor film to a second thickness at the second opening in the high-voltage region, such that the second thickness is at least 13 nm greater than the first thickness; and epitaxially growing the carrier bulk in the localized monolithic region simultaneously with the epitaxially growing the semiconductor film.

BRIEF DESCRIPTION OF THE DRAWINGS

Further advantages and characteristics of the invention will become apparent from the detailed description of non-limiting embodiments and implementations and the attached drawings in which.

DETAILED DESCRIPTION OF ILLUSTRATIVE EMBODIMENTS

Figure 1:
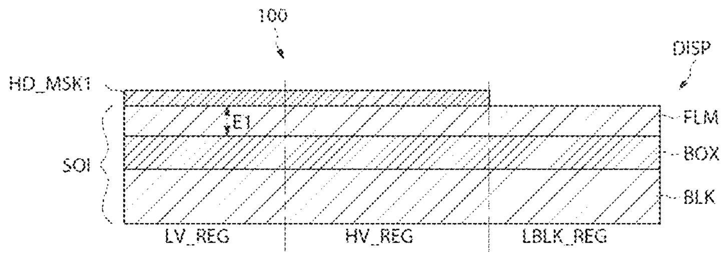
FIG. 1 is a simplified cross-section view schematic illustrating a step of a method embodiment for manufacturing a semiconductor device using an SOI type bulk.
Figure 11:
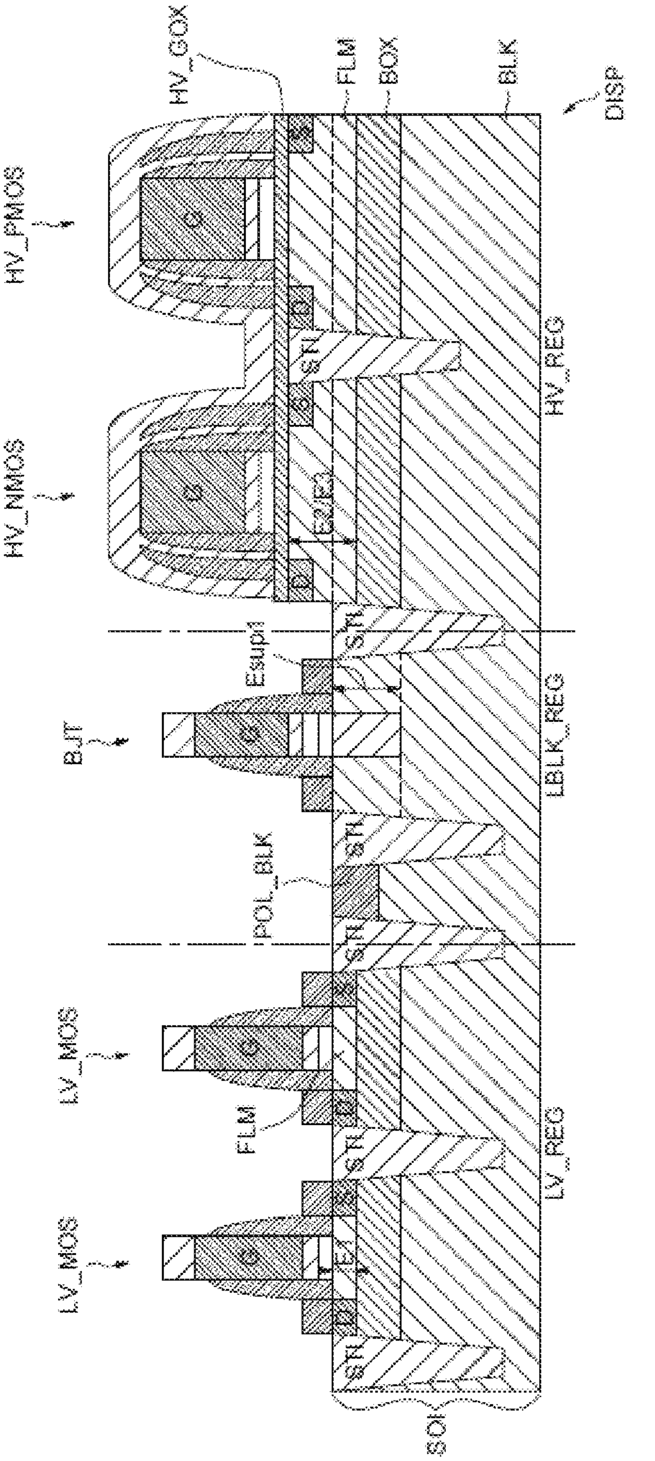
FIG. 11 is a simplified cross-section view schematic illustrating an embodiment semiconductor device having low-voltage and high-voltage transistors formed from an SOI type bulk.

FIG. 1 schematically shows the result of a step 100 of a method for manufacturing at least one high-voltage HV_NMOS, HV_PMOS transistor (example resulting device shown in FIG. 11).

Step 100 includes obtaining a silicon-on-insulator SOI type bulk and forming a hard mask HD_MSK1. The SOI bulk may include a carrier bulk BLK, a buried dielectric layer BOX, and a semiconductor film FLM, for example. The material of the carrier bulk BLK and the semiconductor film FLM may be silicon, for example. The buried dielectric layer BOX may be a layer of silicon oxide of the formula $SiO_2$, for example.

The semiconductor film FLM has a first thickness E1 and is electrically insulated from the carrier bulk BLK by the buried dielectric layer BOX. For example, the thickness E1 of the semiconductor film may be less than or equal to 7 nm, preferably may be between 4 nm and 7 nm.

In an embodiment, the silicon-on-insulator SOI type bulk may have at least three distinct regions: a low-voltage region LV_REG, a high-voltage region HV_REG and a localized monolithic region LBLK_REG.

The high-voltage transistors HV_NMOS, HV_PMOS may be manufactured in and on the high-voltage region HV_REG of the silicon-on-insulator SOI type bulk and may be provided to operate at voltages between 2 volts and 5 volts, for example.

The low-voltage region LV_REG may be used for manufacturing "low-voltage" MOS transistors, for example provided to operate at voltages below 2 volts.

The localized monolithic region LBLK_REG may be used for manufacturing plug outlets POL_BLK of the carrier bulk BLK, or other types of semiconductor components, such as bipolar transistors BJT, for example.

As illustrated in FIG. 1, the hard mask HD_MSK1 may be a mask of silicon nitride of the formula Si3N4, for example. The hard mask HD_MSK1 may cover the semiconductor film FLM in the low-voltage region LV_REG and in the high-voltage region HV_REG and may uncover the semiconductor film FLM in the monolithic region LBLK_REG.

FIGS. 2 to 6 show the results of steps 110 to 114 of a first implementation example of a method embodiment.

Figure 2:
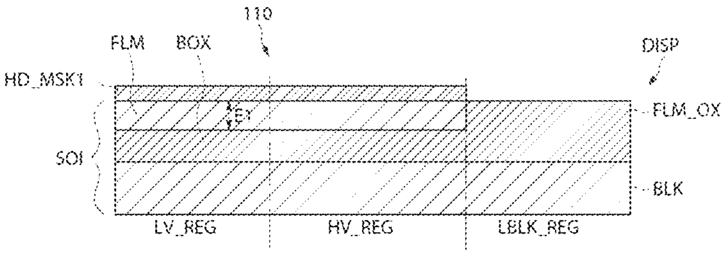
FIG. 2 is a simplified cross-section view schematic illustrating another step of a method embodiment.

FIG. 2 shows the result of a step 110 of oxidizing the semiconductor film FLM in the localized monolithic region LBLK_REG. For example, the semiconductor film FLM may be oxidized using conventional oxidation techniques known to a skilled person. Following oxidation, the oxidized semiconductor film FLM_OX may form a homogeneous layer of silicon oxide SiO2 with the buried dielectric layer BOX.

Figure 3:
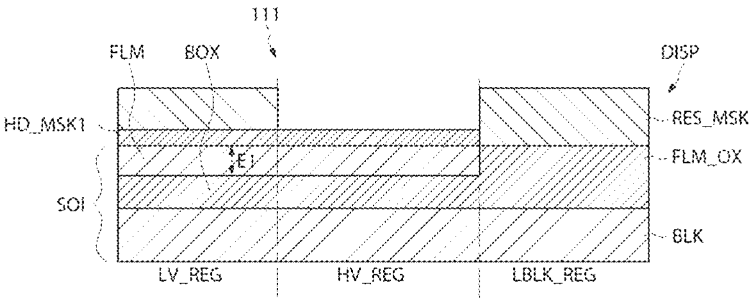
FIG. 3 is a simplified cross-section view schematic illustrating another step of a method embodiment.

FIG. 3 shows the result of a step 11 of forming a resin mask RES_MSK.

In this step 11, the resin mask RES_MSK covers the hard mask HD_MSK1 in the low-voltage region LV_REG and the oxidized semiconductor film FLM_OX in the localized monolithic region LBLK_REG. The hard mask HD_MSK1 is uncovered in the high-voltage region HV_REG.

Figure 4:
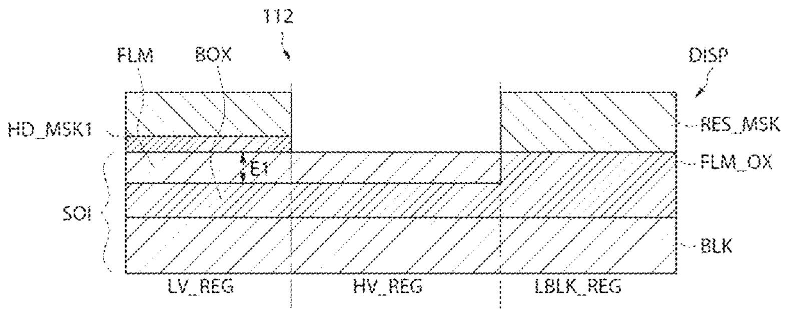
FIG. 4 is a simplified cross-section view schematic illustrating another step of a method embodiment.

FIG. 4 shows the result of a step 112 of etching the hard mask HD_MSK1. The etching 112 is adapted to remove the hard mask HD_MSK1 in the regions that are not covered by the resin mask RES_MSK, i.e. in particular in the high-voltage region HV_REG. At the end of step 112, the resin mask RES_MSK is removed.

Figure 5:
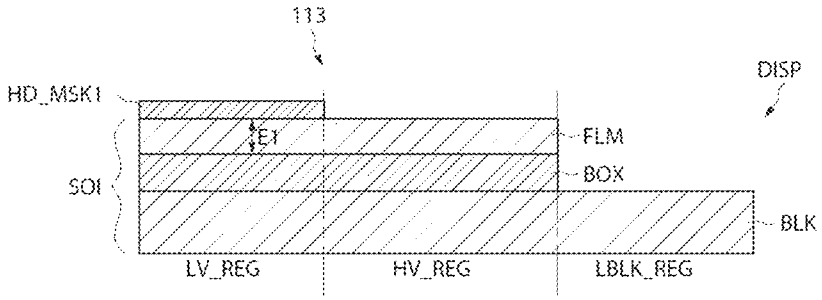
FIG. 5 is a simplified cross-section view schematic illustrating another step of a method embodiment.

FIG. 5 shows the result of a step 113 of etching the oxidized semiconductor film FLM_OX. The etching step 113, which may be for example wet etching, is configured to selectively etch the silicon oxide and not etch, or etch with a dynamic range much lower than the etching dynamic range of the silicon oxide, the crystalline silicon of the semiconductor film FLM and the carrier bulk BLK. Thus, step 113 selectively removes the oxidized semiconductor film FLM_OX and the buried dielectric layer BOX in the localized monolithic region LBLK_REG.

Consequently, at the end of step 113, the silicon semiconductor film FLM is uncovered in the high-voltage region HV_REG and the silicon carrier bulk BLK is uncovered in the localized monolithic region LBLK_REG. The hard mask HD_MSK1 now only covers the semiconductor film FLM in the low-voltage region LV_REG.

Figure 6:
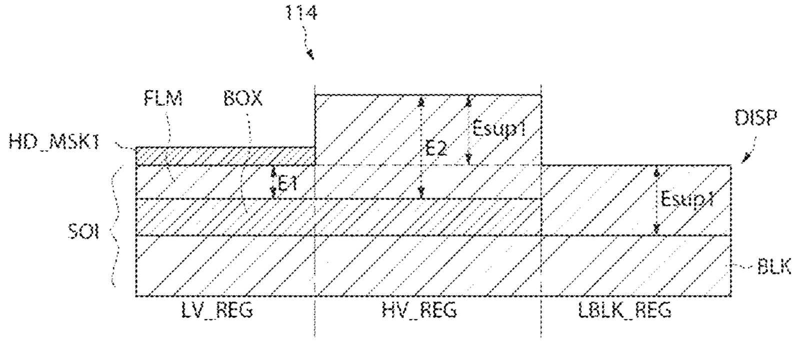
FIG. 6 is a simplified cross-section view schematic illustrating another step of a method embodiment.

FIG. 6 shows the result of a step 114 of epitaxially growing the semiconductor film FLM and the carrier bulk BLK. The epitaxy grows crystalline silicon from the uncovered layers of crystalline silicon, i.e. the semiconductor film FLM in the high-voltage region HV_REG and the carrier bulk BLK in the localized monolithic bulk region LBLK_REG.

Thus, in this implementation, growth of the semiconductor film FLM may be performed "free of charge" in the same step 114 performed simultaneously with growth of the carrier bulk BLK in the localized monolithic region LBLK_REG.

In particular, an additional thickness Esup1 may be chosen so that the carrier bulk layer BLK in the localized monolithic region LBLK_REG reaches the same height as the surface layers of the other regions of the SOI bulk, for example the surface of the semiconductor film FLM in the low-voltage region LV_REG.

Given that the growth of the semiconductor film FLM is conditional on growth of the carrier bulk BLK, the semiconductor film FLM may grow by the additional thickness Esup1, in the high-voltage region HV_REG.

Thus, as illustrated in FIG. 6, a second total thickness E2 of the semiconductor film FLM in the high-voltage region HV_REG is obtained, which corresponds to the sum of the first thickness E1 and the additional thickness Esup1, and is thus greater than the first thickness E1. The additional thickness Esup1 may be between 10 nm and 25 nm, for example. The second total thickness E2 may be greater than or equal to 20 nm, and is preferably between 20 nm and 25 nm. The second thickness E2 may be, for example, 25 nm for a first thickness E1 equal to 7 nm plus an additional thickness Esup1 equal to 18 nm. It may be advantageous to define a second thickness E2 less than or equal to 25 nm so as to ensure that the semiconductor film FLM is fully depleted. However, these values are given as non-limiting examples and it is contemplatable to provide a thicker or thinner semiconductor film FLM, for example for a second thickness E2 of less than 20 nm, or more than 25 nm, and consequently perhaps without benefiting from the fully depleted effect.

The growth of the semiconductor film FLM may allow to form, in the high-voltage region HV_REG where the high-voltage transistors are manufactured, a semiconductor film FLM that is sufficiently thick to avoid the hot-carrier injection phenomenon, but also sufficiently thin to benefit from the performance advantages of silicon-on-insulator devices and thus to improve the performance of the high-voltage transistors.

In this respect, the second total thickness E2 of the semiconductor film FLM in the high-voltage region HV_REG may be sufficiently small to generate a fully depleted state throughout the thickness of the semiconductor film FLM in the presence of a channel region of the high-voltage transistor HV_NMOS, HV_PMOS, for example.

Indeed, a semiconductor film in a fully depleted state may allow to ensure a better electrostatic control of the channel of high-voltage transistors and to reduce short channel effects.

FIGS. 7 to 10 show the results of steps 120 to 123 of a second implementation example of a method embodiment which also initially starts at step 100 previously described in connection with FIG. 1.

Figure 7:
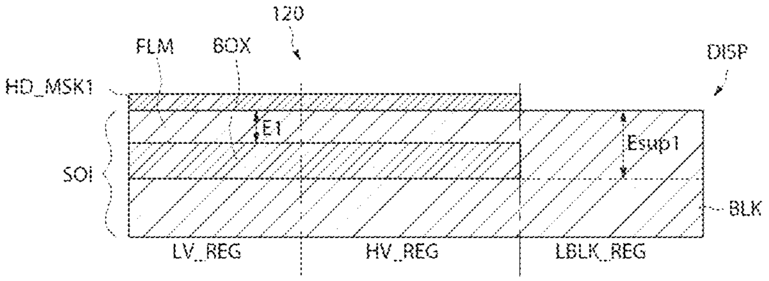
FIG. 7 is a simplified cross-section view schematic illustrating a step of another method embodiment for manufacturing a semiconductor device using an SOI type bulk.

FIG. 7 shows the result of steps 120 corresponding to a conventional formation of the localized monolithic bulk region LBLK_REG. In particular, steps 120 include steps 100, 110, 113 and 114 previously described in connection with FIGS. 1, 2, 5 and 6, without implementing steps 11 and 112 previously described in connection with FIGS. 3 and 4, so that the hard mask HD_MSK1 also covers the semiconductor film FLM in the high-voltage region HV_REG in epitaxial growth step 114, thus performed exclusively in the localized monolithic region LBLK_REG.

Figure 8:
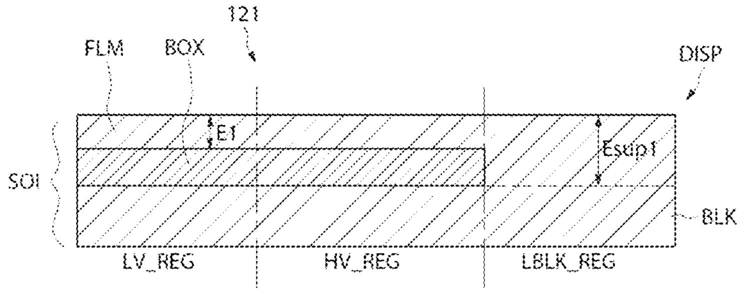
FIG. 8 is a simplified cross-section view schematic illustrating another step of a method embodiment.

FIG. 8 shows the result of an etching step 121 adapted to fully remove the mask HD_MSK1, i.e. in the low-voltage region LV_REG and in the high-voltage region HV_REG.

Figure 9:
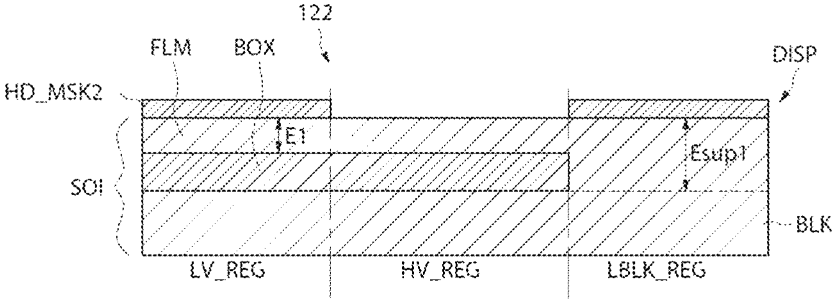
FIG. 9 is a simplified cross-section view schematic illustrating another step of a method embodiment.

FIG. 9 shows the result of a step 122 of forming and etching a dedicated hard mask HD_MSK2 for growing the semiconductor film FLM in the high-voltage region HV_REG. The hard mask HD_MSK2 may be a mask of silicon nitride and is formed on the semiconductor film FLM of the SOI bulk.

Still referring to FIG. 9, the layer of silicon nitride is etched to uncover only the semiconductor film FLM in the high-voltage region HV_REG and to cover the SOI bulk outside the high-voltage region HV_REG, i.e. in particular the semiconductor film FLM in the low-voltage region LV_REG and the carrier bulk BLK in the localized monolithic region LBLK_REG.

Figure 10:
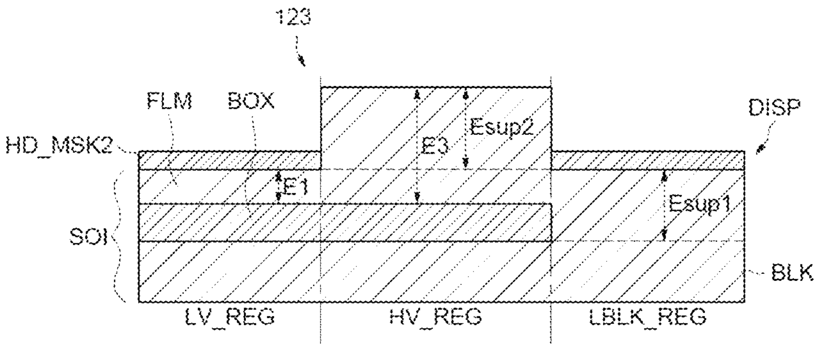
FIG. 10 is a simplified cross-section view schematic illustrating another step of a method embodiment.

FIG. 10 shows the result of a step 123 of epitaxially growing the semiconductor film FLM in the high-voltage region HV_REG.

The epitaxial growth in step 123 substantially corresponds to the growth in step 114 previously described in connection with FIG. 6, but does not depend on the growth of the carrier bulk BLK performed in the localized monolithic region LBLK_REG.

As a result, the semiconductor film FLM may grow by an additional thickness Esup2, selectively in the high-voltage region HV_REG.

Thus, a second total thickness E3 of the semiconductor film FLM in the high-voltage region HV_REG is obtained, which corresponds to the sum of the first thickness E1 and the additional thickness Esup2, and is thus greater than the first thickness E1.

An additional (not shown) etching step may be performed in order to remove the hard mask HD_MSK2 in the low-voltage region LV_REG and in the localized monolithic region LBLK_REG.

This second implementation example of a method embodiment (illustrated in FIGS. 1, and 7-10) may thus allow to control the thickness of the semiconductor film FLM in the high-voltage region independently of the restrictions of another epitaxy step, for example those that may be imposed by the growth of the carrier bulk BLK as described in step 114 of the method embodiment according to the first implementation example (illustrated in FIGS. 1-6). The second total thickness E3 of the semiconductor film FLM in the high-voltage region may thus be set to a size specifically dimensioned for the high-voltage transistors HV_NMOS, HV_PMOS.

The additional thickness Esup2 may be between 10 nm and 25 nm, for example. The second total thickness E3 may be greater than or equal to 20 nm and is preferably between 20 nm and 25 nm, for example. The second thickness E3 may be, for example, 25 nm for a first thickness E1 equal to 7 nm plus an additional thickness Esup2 equal to 18 nm. It may be advantageous to define a second thickness E3 of less than 25 nm in order to ensure that the semiconductor film FLM is fully depleted. However, these values are given as non-limiting examples and it is contemplatable to provide a thicker or thinner semiconductor film FLM, for example, for a second thickness E3 of less than 20 nm, or more than 25 nm, and consequently perhaps without benefiting from the fully depleted effect.

In short, the method embodiment described in connection with FIGS. 1 to 10 may allow to form the semiconductor film FLM having a second thickness E2 in the high-voltage region HV_REG equal to the sum of the first thickness E1 and the additional thickness Esup1, or alternatively, a second total thickness E3 equal to the sum of the first thickness E1 and the additional thickness Esup2 which may be different from the additional thickness Esup1 obtained in the first implementation example of a method embodiment.

FIG. 11 shows an example semiconductor device DISP that may be obtainable from the manufacturing methods described in connection with FIGS. 1 to 10.

The semiconductor device DISP includes at least one high-voltage transistor HV_NMOS, HV_PMOS formed in and on the high-voltage region HV_REG of the silicon-on-insulator SOI type bulk. For example, an NMOS type high-voltage transistor HV_NMOS and a PMOS type high-voltage transistor HV_PMOS may be formed in and on the high-voltage region HV_REG. Each of the high-voltage transistors HV_NMOS, HV_PMOS includes a gate region G located at the semiconductor film FLM in the high-voltage region HV_REG and conduction regions, i.e. a drain region D and a source region S, implanted in the semiconductor film FLM in the high-voltage region HV_REG. The high-voltage transistors HV_NMOS, HV_PMOS may be MOS transistors provided to operate at voltages between 2 volts and 5 volts, for example.

A gate dielectric layer HV_GOX may be located between the gate region G of the transistors HV_NMOS, HV_PMOS, and the semiconductor film FLM.

As a reminder, the second total thickness E2 or E3, depending on the implementation described above, of the semiconductor film FLM in the high-voltage region HV_REG may be sufficiently small to generate a fully depleted state throughout the thickness of the semiconductor film FLM located facing the gate region G of the high-voltage transistor, when the channel region of the high-voltage transistor HV_NMOS, HV_PMOS is formed.

By "sufficiently small" it is meant, for example, that the second total thickness E2 or E3 of the semiconductor film FLM in the high-voltage region HV_REG may be less than 25 nm, for example.

Moreover, low-voltage transistors LV_MOS may be formed in and on the semiconductor film FLM in the low-voltage region LV_REG. The gate regions G and the conduction regions S and D of the transistors LV_MOS may be formed analogously to the gate regions G and the conduction regions S and D of the high-voltage transistors HV_NMOS, HV_PMOS. The low-voltage transistors LV_MOS may be MOS transistors provided to operate at voltages below 2 volts, for example.

Furthermore, a bipolar transistor BJT may be made in and on the carrier bulk BLK in the monolithic localized region LBLK_REG, for example.

A plug outlet POL_BLK may be formed in the localized monolithic region LBLK_REG in order to bias the carrier bulk BLK in the different regions LV_REG, LBLK_REG, HV_REG of the silicon-on-insulator SOI type bulk, for example.

The invention claimed is:

1. A method for manufacturing a high-voltage transistor in and on a high-voltage region of a silicon-on-insulator type bulk including a semiconductor film having a first thickness, electrically insulated from a carrier bulk by a buried dielectric layer, the method comprising:

selectively epitaxially growing the semiconductor film in the high-voltage region to a second thickness that is greater than the first thickness, the semiconductor film remaining at the first thickness in a region outside the high-voltage region; and epitaxially growing the carrier bulk in a localized monolithic region of the silicon-on-insulator type bulk, wherein the epitaxially growing of the semiconductor film in the high-voltage region is performed simultaneously with the epitaxially growing of the carrier bulk in the localized monolithic region, wherein epitaxially growing the carrier bulk in the localized monolithic region comprises:

forming a hard mask comprising a high-voltage mask portion and a first opening, the high-voltage mask portion covering the semiconductor film in the high-voltage region and the first opening uncovering the semiconductor film in the localized monolithic region;

oxidizing the semiconductor film in the localized monolithic region at the first opening; and selectively etching to remove the oxidized semiconductor film and the buried dielectric layer in the localized monolithic region.

2. The method according to claim 1, wherein epitaxially growing the semiconductor film in the high-voltage region comprises etching to remove the high-voltage mask portion of the hard mask in the high-voltage region prior to the epitaxially growing of the semiconductor film in the high-voltage region.

3. The method according to claim 1, further comprising:

forming a gate region of the high-voltage transistor on the semiconductor film having the second thickness of the high-voltage region; and forming conduction regions of the high-voltage transistor in the semiconductor film having the second thickness of the high-voltage region.

4. The method according to claim 3, wherein the second thickness of the semiconductor film in the high-voltage region is configured to generate a fully depleted state throughout the thickness of the semiconductor film in the presence of a channel region of the high-voltage transistor.

5. The method according to claim 1, wherein the second thickness is at least 13 nm greater than the first thickness.

6. The method according to claim 1, wherein the first thickness is less than or equal to 7 nm.

7. A method of manufacturing a semiconductor device, comprising:

forming a hard mask on a silicon-on-insulator type bulk, wherein the silicon-on-insulator type bulk comprises a semiconductor film having a first thickness, electrically insulated from a carrier bulk by a buried dielectric layer, the hard mask comprising a high-voltage mask portion covering the semiconductor film in a high-voltage region and also comprising a first opening uncovering the semiconductor film in a localized monolithic region;

oxidizing the semiconductor film in the localized monolithic region;

selectively etching to remove the oxidized semiconductor film and the buried dielectric layer at the first opening in the localized monolithic region;

etching selectively the hard mask to remove the high-voltage mask portion, such that the hard mask comprises a second opening uncovering the semiconductor film in the high-voltage region;

epitaxially growing the semiconductor film to a second thickness at the second opening in the high-voltage region, such that the second thickness is at least 13 nm greater than the first thickness; and epitaxially growing the carrier bulk in the localized monolithic region simultaneously with the epitaxially growing of the semiconductor film.

8. The method according to claim 7, further comprising forming a high-voltage transistor on the semiconductor film of the high-voltage region, forming the high-voltage transistor comprising:

forming a gate channel region of the high-voltage transistor on the semiconductor film having the second thickness of the high-voltage region; and forming source and drain regions of the high-voltage transistor in the semiconductor film having at least the second thickness of the high-voltage region.

9. The method of claim 7, wherein the first thickness is less than or equal to 7 nm and the second thickness is between 20 nm and 25 nm.

10. The method according to claim 1, wherein the second thickness is between 20 nm and 25 nm.

11. The method according to claim 7, wherein the second thickness is less than or equal to 25 nm.

12. A method of manufacturing a semiconductor device on a silicon-on-insulator type bulk comprising a semiconductor film having a first thickness electrically insulated from a carrier bulk by a buried dielectric layer, the method comprising:

forming a hard mask on the silicon-on-insulator type bulk, the hard mask covering the semiconductor film in a low-voltage region and in a high-voltage region while uncovering the semiconductor film in a localized monolithic region;

oxidizing the semiconductor film in the localized monolithic region;

selectively etching to remove the oxidized semiconductor film and the buried dielectric layer in the localized monolithic region to expose the carrier bulk;

etching the hard mask to remove the hard mask from the high-voltage region while the hard mask remains covering the semiconductor film in the low-voltage region;

epitaxially growing the semiconductor film in the high-voltage region to a second thickness less than 25 nm simultaneously with epitaxially growing the carrier bulk in the localized monolithic region, the semiconductor film remaining at the first thickness in the low-voltage region throughout;

forming a high-voltage transistor in and on the semiconductor film having the second thickness in the high-voltage region;

forming a low-voltage transistor in and on the semiconductor film having the first thickness in the low-voltage region; and forming a transistor in and on the epitaxially grown carrier bulk in the localized monolithic region.

13. The method according to claim 12, wherein the first thickness is less than or equal to 7 nm.

14. The method according to claim 13, wherein the second thickness is between 20 nm and 25 nm.

15. The method according to claim 12, wherein the second thickness is at least 13 nm greater than the first thickness.

16. The method according to claim 12, wherein the second thickness of the semiconductor film in the high-voltage region is configured to generate a fully depleted state throughout the thickness of the semiconductor film in the presence of a channel region of the high-voltage transistor.

17. The method according to claim 12, wherein forming the hard mask comprises forming a silicon nitride mask, and wherein etching the hard mask to remove the hard mask from the high-voltage region comprises selectively etching the silicon nitride mask such that the silicon nitride mask is removed from the high-voltage region while remaining over the semiconductor film in the low-voltage region.

18. The method according to claim 12, wherein forming the high-voltage transistor comprises:

forming a gate region of the high-voltage transistor on the semiconductor film having the second thickness in the high-voltage region; and forming source and drain regions of the high-voltage transistor in the semiconductor film having the second thickness in the high-voltage region.

19. The method according to claim 12, wherein the high-voltage transistor is designed to operate at a voltage between 2 volts and 5 volts, and the low-voltage transistor is designed to operate at a voltage below 2 volts.

20. The method according to claim 12, wherein epitaxially growing the carrier bulk in the localized monolithic region is performed such that a top surface of the epitaxially grown carrier bulk in the localized monolithic region is substantially coplanar with a top surface of the semiconductor film in the low-voltage region.

* * * * *